US007463231B2

(12) United States Patent
Miura

(10) Patent No.: US 7,463,231 B2
(45) Date of Patent: Dec. 9, 2008

(54) GRAYSCALE VOLTAGE GENERATING CIRCUIT AND METHOD

(75) Inventor: Makoto Miura, Tsuruoka (JP)

(73) Assignee: Nec Electronics Corporation, Kanagawa (JP)

( * ) Notice: Subject to any disclaimer, the term of this patent is extended or adjusted under 35 U.S.C. 154(b) by 664 days.

(21) Appl. No.: 11/209,639

(22) Filed: Aug. 24, 2005

(65) Prior Publication Data

US 2006/0050036 A1 Mar. 9, 2006

(30) Foreign Application Priority Data

Sep. 9, 2004 (JP) ............................ 2004-262113

(51) Int. Cl.
*G09G 3/36* (2006.01)
*G11C 99/00* (2006.01)

(52) U.S. Cl. .......................... 345/89; 330/148; 377/65; 377/75; 345/690

(58) Field of Classification Search .................. 345/89, 345/690; 377/64, 70, 76, 77; 330/147, 148, 330/250
See application file for complete search history.

(56) References Cited

U.S. PATENT DOCUMENTS

| | | | | |
|---|---|---|---|---|
| 6,967,531 | B1 * | 11/2005 | Seymour | 330/148 |
| 2002/0050970 | A1 * | 5/2002 | Kajihara et al. | 345/89 |

FOREIGN PATENT DOCUMENTS

| | | |
|---|---|---|
| JP | 6-348235 | 12/1994 |
| JP | 11-281953 | 10/1999 |
| JP | 2002-366112 | 12/2002 |

* cited by examiner

*Primary Examiner*—Mark A. Robinson
*Assistant Examiner*—Liliana Cerullo
(74) *Attorney, Agent, or Firm*—Young & Thompson

(57) ABSTRACT

The grayscale voltage generating circuit comprises an input/driving stage circuit amplifying an input voltage and output stage circuits receiving a output voltage from the input/driving stage circuit, outputting one of the grayscale voltages, and having a capacitor to keep a voltage level of the grayscale voltage. The output stage circuits are sequentially switched to be connected with the input/driving stage circuit, and an output voltage from the input/driving stage circuit is fed to the plurality of output stage circuits in order. Each of the output stage circuits outputs the grayscale voltage based on a voltage held in the capacitor irrespective of connection with the input/driving stage circuit.

13 Claims, 3 Drawing Sheets

RELATED ART

GRAYSCALE VOLTAGE GENERATING CIRCUIT AND METHOD

BACKGROUND OF THE INVENTION

1. Field of the Invention

The present invention relates to a grayscale voltage generating circuit and method for driving a multicolor display device.

2. Description of Related Art

In general, a brightness of a liquid crystal panel of an active matrix type liquid crystal display device using thin film transistors (TFTs) is adjusted by changing voltage applied to a source terminal of the TFT provided to each pixel of the liquid crystal panel. To that end, the liquid crystal display device is equipped with a grayscale voltage generating circuit capable of generating multi-level voltages (hereinafter referred to as "grayscale voltages").

FIG. 3 shows an example of a relation between the voltages applied to a source terminal of a TFT and a grayscale value. Denoted by 21 to 28 are grayscale voltages corresponding to the 8-level grayscales. For adjusting brightness in 8-level grayscales as shown in FIG. 3, a liquid crystal display device should incorporate a grayscale voltage generating circuit capable of generating grayscale voltages corresponding to the 8 grayscale values. Similarly, a liquid crystal display device for adjusting brightness in 64-level grayscales should incorporate a grayscale voltage generating circuit capable of generating grayscale voltages corresponding to the 64 grayscale values. Such grayscale voltage generating circuits are disclosed in, for example, Japanese Unexamined Patent Publication Nos. 06-348235 (Sumiya), 11-281953 (Watanabe), and 2002-366112 (Kudoh).

FIG. 4 shows a structural example of a liquid crystal display device incorporate a grayscale voltage generating circuit. Grayscale voltages generated in a grayscale voltage generating circuit 41 are input to a signal line driver 42. The signal line driver 42 supplies a grayscale voltage to each signal line of a liquid crystal panel 43, that is, each source line for applying the voltage to a source terminal of a TFT provided to each pixel. The signal line driver 42 selects a grayscale voltage corresponding to an image data signal Sd, from among grayscale voltage signals output from the grayscale voltage generating circuit 41, and supplies the selected grayscale voltage to the signal line to drive the liquid crystal panel 43.

In FIG. 4, a scan line driver 44 supplies voltage to a scan line of the liquid crystal panel 43, that is, a gate line for applying a gate voltage to a TFT. The above signal line driver 42 applies voltages corresponding to a brightness of each pixel to all the signal lines, in synchronization with scan timing of the scan line driver 44. Thereby liquid crystal panel 43 displays an image corresponding to one frame.

FIG. 5 shows a configuration example of the conventional grayscale voltage generating circuit 41. The voltage between a high-level reference voltage VDD and a low-level reference voltage VSS is divided by a ladder resistor 51 to thereby generate n-level grayscale voltages. The grayscale voltages divided by the ladder resistor 51 are applied to noninverting input terminals of operational amplifiers OP1 to OPn. The operational amplifiers OP1 to OPn each include a negative-feedback circuit connecting between an output terminal and a inverting input terminal, and serve as voltage followers for outputting the voltage equivalent to the input voltage to convert an output impedance. Output voltages V1 to Vn from the operational amplifiers OP1 to OPn are fed to the signal line driver 42 as grayscale voltage signals. For example, in the case of representing 8-level grayscales, the output voltages V1 to V8 from the 8 operational amplifiers OP1 to OP8 are fed to the signal line driver 42 as grayscale voltages.

Further, the grayscale voltage generating circuit 41 of FIG. 5 can generate many more levels of grayscale voltages by further dividing the output voltages from the operational amplifiers OP1 to OPn by means of a ladder resistor 52 provided on the output side of the operational amplifiers OP1 to OPn. Japanese Unexamined Patent Publication No. 2002-366112 (Kudoh) discloses a configuration example where output voltages from 10 operational amplifiers are further divided through resistors to generate 64-level grayscale voltages.

There is another grayscale voltage generating circuit where, as shown in FIG. 5, series-connected resistors constituting the ladder resistor 51 are variable resistors (see Japanese Unexamined Patent Publication Nos. 06-348235 (Sumiya) and 2002-366112 (Kudoh), for example). If a resistance value of the variable resistor is changed, a level of the input voltage to the operational amplifiers OP1 to OPn varies, thereby changing the output voltages V1 to Vn from the operational amplifiers OP1 to OPn. Hence, resistance values of the variable resistors constituting the ladder resistor 51 are changed to adjust the grayscale voltage into desired grayscale characteristics.

However, the present invention has recognized that, above-mentioned conventional grayscale voltage generating circuit needs to use many operational amplifiers for outputting grayscale voltages, in accordance with the number of grayscale values. In general, 8-level grayscale voltage generating circuit generates grayscale voltages with 8 operational amplifiers. Besides, the 64-level grayscale voltage generating circuit as disclosed in Japanese Unexamined Patent Publication No. 2002-366112 (Kudoh) uses 10 operational amplifiers. In such a grayscale voltage generating circuit generating multi-level grayscale voltages, many operational amplifiers need to be arranged on a chip, and a chip area disadvantageously increases.

SUMMARY OF THE INVENTION

According to one aspect of the present invention, there is provided a grayscale voltage generating circuit for generating grayscale voltages. The circuit includes an input/driving stage circuit amplifying an input voltage and a plurality of output stage circuits receiving a output voltage from the input/driving stage circuit, outputting one of the grayscale voltages, and having a capacitor to keep a voltage level of the grayscale voltage. In the grayscale voltage generating circuit, the plurality of output stage circuits are sequentially switched to be connected with the input/driving stage circuit, and the output voltage from the input/driving stage circuit is fed to the plurality of output stage circuits in order, and each of the plurality of output stage circuits outputs one of the grayscale voltages based on a voltage held in the capacitor irrespective of whether or not connected with the input/driving stage circuit. According to this configuration, the plurality of operational amplifiers necessary for outputting grayscale voltages can share the input/driving stage circuit. Consequently, the input/driving stage circuit placed on a chip may be commonly used, and only the output stage circuits should be arranged in accordance with the number of grayscale values.

According to another aspect of the present invention, there is provided a method of generating grayscale voltages for driving a display element. the method includes connecting a first complementary transistor in a plurality of complementary transistors outputting the grayscale voltage, with a driving circuit driving the plurality of complementary transistors; outputting a first voltage from the first complementary transistor, and charging a first capacitor provided between a gate and a source of the first complementary transistor; switching the driving circuit to be connected with a second complementary transistor in the plurality of complementary transistors; outputting a second voltage from the second complementary transistor, and charging a second capacitor provided between a gate and a source of the second complementary transistor; and continuously outputting the first voltage from the first complementary transistor by using a voltage held in the first capacitor even after the driving circuit is switched to be connected with the second complementary transistor. According to this method, in the grayscale voltage generating circuit, the plurality of operational amplifiers necessary for outputting grayscale voltages can share the input/driving stage circuit.

According to the present invention, in the grayscale voltage generating circuit, the plurality of operational amplifiers necessary for outputting grayscale voltages can share the input/driving stage circuit.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment of the Invention

A typical operational amplifier is composed of an input stage circuit, a driving stage circuit, and an output stage circuit. The input stage circuit amplifies a differential voltage between an input voltage at a noninverting input terminal and an input voltage at an inverting input terminal. The driving stage circuit feeds the differential voltage output from the input stage circuit to the output stage circuit. Also, the output stage circuit outputs the voltage for driving an external load such as a liquid crystal element, in accordance with a voltage signal input from the driving stage circuit. The grayscale voltage generating circuit 10 according to an embodiment of the present invention has a feature that plural operational amplifiers (voltage followers) share the input stage circuit and the driving stage circuit, and only the output stage circuits are individually provided unlike the structure of the operation amplifier (voltage follower) provided to the aforementioned conventional grayscale voltage generating circuit 41 or the like.

Figure 1:
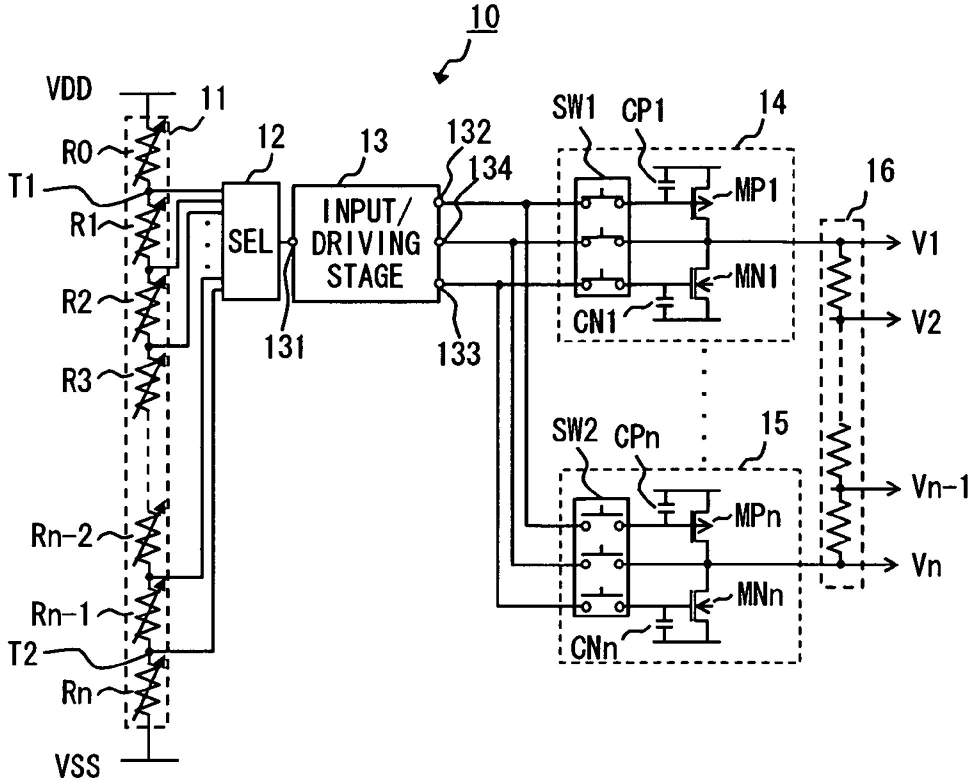
FIG. 1 is a diagram showing a grayscale voltage generating circuit of the present invention.

FIG. 1 shows the configuration of the grayscale voltage generating circuit of this embodiment. A ladder resistor 11 divides the voltage between a high-level reference voltage VDD and a low-level reference voltage VSS by means of series-connected resistors R0 to Rn. Note that the resistors R0 to Rn may be either fixed resistors or variable resistors as shown in FIG. 1. Assuming that the resistors R0 to Rn are variable ones, as discussed in the description of the related art, resistance values of the resistors R0 to Rn are changed to thereby adjust the grayscale voltages into desired grayscale characteristics.

A selector circuit 12 selects one of the nodes between the resistors R0 to Rn, thereby selecting the voltage to be applied to a noninverting input terminal 131 of an input/driving stage circuit 13. Here, the selector circuit 12 needs only to select the voltage to be applied to the input/driving stage circuit 13 and thus may be configured to select such a voltage through an on/off operation of n switches provided at the respective nodes between the resistors R0 to Rn.

The input/driving stage circuit 13 corresponds to an input stage circuit and driving stage circuit composing an operational amplifier. The input/driving stage circuit 13 operates as a single voltage follower for converting an output impedance, in combination with an output stage circuit 14 or 15 described below. Output stage driving terminals 132 and 133 of the input/driving stage circuit 13 are connected to gate terminals of transistors constituting the output stage circuit 14 or 15 described below. Also, an inverting input terminal 134 is connected to an output of the output stage circuit 14 or 15 described below.

The output stage circuits 14 and 15 each correspond to an output stage circuit composing the operational amplifier. The output stage circuit 14 is configured by connecting a drain of a P-channel MOS transistor MP1 with a drain of an N-channel MOS transistor MN1. The drain terminals of the transistors MP1 and MN1 are connected to an inverting input terminal 134 of the input/driving stage circuit 13 as well as to a ladder resistor 16. Further, a gate of the transistor MP1 is connected to the output stage driving terminal 132 of the input/driving stage circuit 13, while a gate of the transistor MN1 is connected to the output stage driving terminal 133 of the input/driving stage circuit 13. Besides, the output stage circuit 14 includes a capacitor CP1 interposed between the gate and source of the P-channel MOS transistor MP1, and a capacitor CN1 interposed between the gate and source of the N-channel MOS transistor MN1. In addition, the output stage circuit 14 includes a switch SW1 for connection/disconnection with/from the input/driving stage circuit 13.

Note that the configuration of the output stage circuit 15 is the same as that of the output stage circuit 14, so its description is omitted here. For ease of explanation, output stage circuits other than the output stage circuits 14 and 15 are omitted from FIG. 1. In practice, the grayscale voltage generating circuit 10 according to this embodiment includes n output stage circuits in total, with a view to generating the grayscale voltages V1 to Vn corresponding to n-level grayscales. In short, the grayscale voltage generating circuit 10 is so configured that the n output stage circuits can be connected with one input/driving stage circuit 13.

The grayscale voltage generating circuit 10 of FIG. 1 generates grayscale voltages the same as the number of the output stage circuits, but may generate many more levels of grayscale voltages by further dividing the output voltage from the output stage circuit by means of the ladder circuit 16.

Next, an operation of the grayscale voltage generating circuit 10 is described. The following description is focused on: a circuit operation in the case of outputting a voltage input to the noninverting input terminal 131, as an output voltage V1 from the output stage circuit 14 when the selector circuit 12 selects a node T1 of FIG. 1; and a circuit operation in the case of outputting a voltage input to the noninverting input terminal 131, as an output voltage Vn from the output stage circuit 15 when the selector circuit 12 selects a node T2 of FIG. 1. Voltages at the terminals T1 and T2 are indicated by Vin1 and Vin2, respectively.

(1) First of all, the selector circuit 12 selects the node T1. Further, the switch SW1 of the output stage circuit 14 is turned on, while the switch SW2 and switches of output stage circuits other than the output stage circuit 14 are turned off. Hence, the input/driving stage circuit 13 and the output stage circuit 14 constitute one operational amplifier, more specifically, a voltage follower. At this time, the voltage Vin1 at the node T1, which has been input to the noninverting input terminal 131, is output as the voltage V1 by way of the input/driving stage circuit 13 and the output stage circuit 14. Further, the capacitors CP1 and CN1 are charged, and hold a gate-source voltage VGS of the transistor MP1 and a gate-source voltage VGS of the transistor MN1.

(2) Next, the switch SW1 is turned off, so all the switches of the output stage circuits are in an off state. At this time, owing to voltages held in the capacitors CP1 and CN1, a gate-source voltage similar to the voltage applied before the switch SW1 is turned off is applied to the transistors MP1 and MN1 to thereby keep the output voltage V1 level of the output stage circuit 14.

(3) The selector circuit 12 selects the node T2. Further, the switch SW2 of the output stage circuit 15 is turned on, while the switch SW1 and switches of output stage circuits other than the output stage circuit 15 are turned off. Hence, the input/driving stage circuit 13 and the output stage circuit 15 constitute one operational amplifier, more specifically, a voltage follower. At this time, the voltage Vin2 at the node T2, which has been input to the noninverting input terminal 131, is output as the voltage Vn by way of the input/driving stage circuit 13 and the output stage circuit 15. Further, the capacitors CPn and CNn are charged, and hold a gate-source voltage VGS of the transistor MPn and a gate-source voltage VGS of the transistor MNn.

(4) The switch SW2 is turned off, so all the switches are in an off state. At this time, owing to voltages held in the capacitors CPn and CNn, a gate-source voltage similar to the voltage applied before the switch SW2 is turned off is applied to the transistors MPn and MNn to thereby keep the output voltage Vn level of the output stage circuit 15.

Through the above operations (1) to (4), the output voltages from the output stage circuits 14 and 15 can be adjusted into a desired grayscale voltage. In the above operations (1) to (4), adjusting the output voltage V1 leads to an offset of the output voltage Vn. In contrast, adjusting the output voltage Vn leads to an offset of the output voltage V1. However, if the above operations (1) to (4) are repeated, such an offset hardly occurs. As a result, the output voltages are finally stabilized at desired voltage values. Provided that the above operations (1) to (4) are repeated m times, voltage values of the output voltages V1 and Vn may be derived from the following formulas:

$$V1=Vin1-(Vin1/4^{m}-Vin2/(2*4^{m-1}))$$

$$Vn=Vin2-(Vin2/4^{m}-Vin1/(2*4^{m}))$$

As is understood from those formulas, if the above operations are repeated, the voltage V1 converges Vin1, and the voltage V1 converges Vin2.

Figure 2:
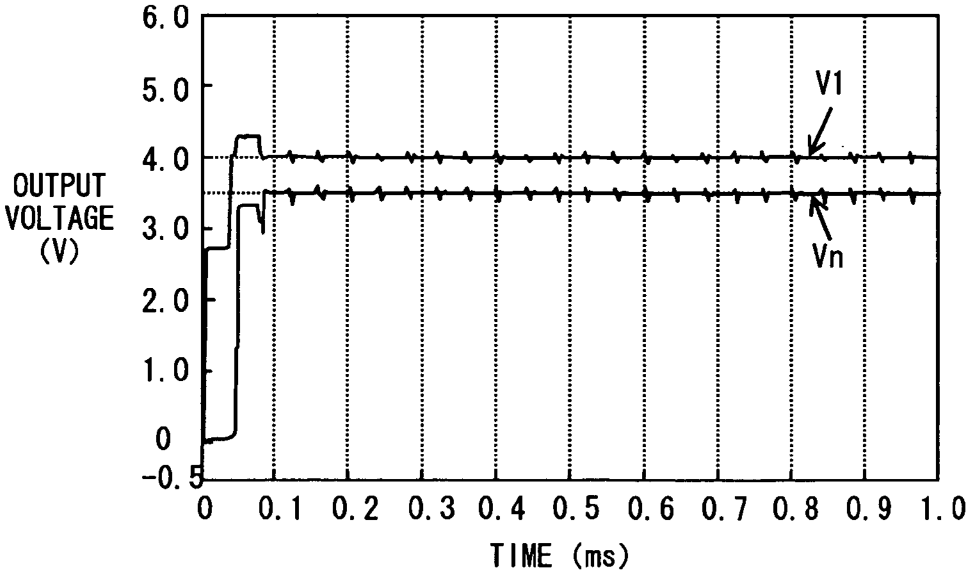
FIG. 2 is a waveform diagram showing an output voltage of the grayscale voltage generating circuit of the invention.
Figure 3:
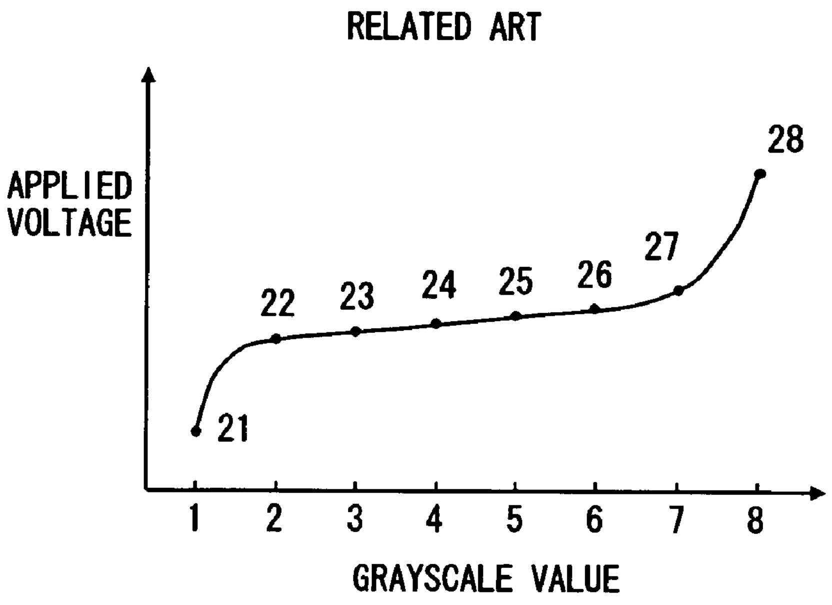
FIG. 3 shows a relation between a grayscale number and voltage applied to a liquid crystal panel.

FIG. 2 is a simulation waveform diagram showing how the output voltages V1 and Vn converge. Note that the simulation result of FIG. 2 is obtained under such a condition that Vin1=+4 V, Vin2=+3.5 V, and these series of operations (1) to (4) are repeated at 0.04 ms periods. FIG. 2 reveals that the output voltages V1 and Vn are stabilized at a desired voltage value as a result of repeating the operations several times.

As mentioned above, by operations of the selector circuit 12 and switches such as the switch SW1 and SW2, the output stage circuits containing the output stage circuits 14 and 15 are sequentially switched to be connected with the input/driving stage circuit 13, and an output voltage from the input/driving stage circuit 13 is fed to the output stage circuits in order.

Figure 4:
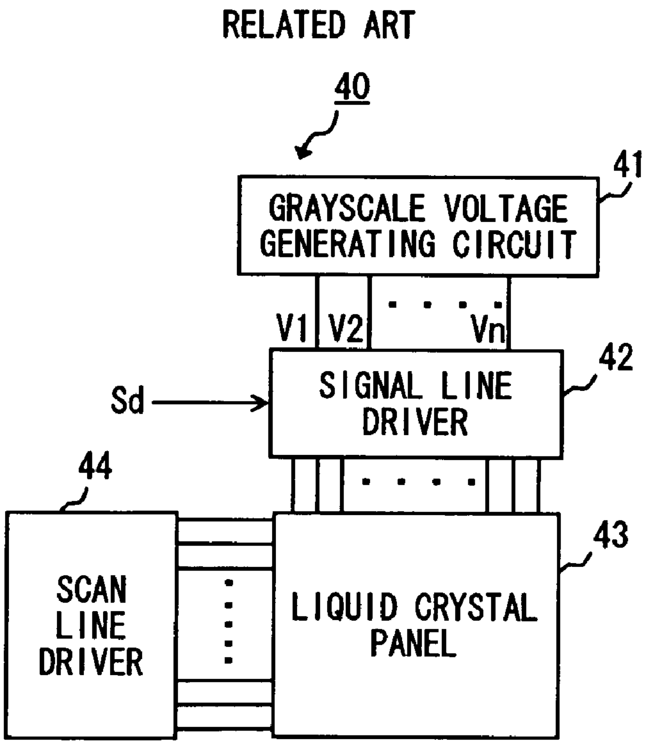
FIG. 4 is a diagram showing a conventional liquid crystal display device.
Figure 5:
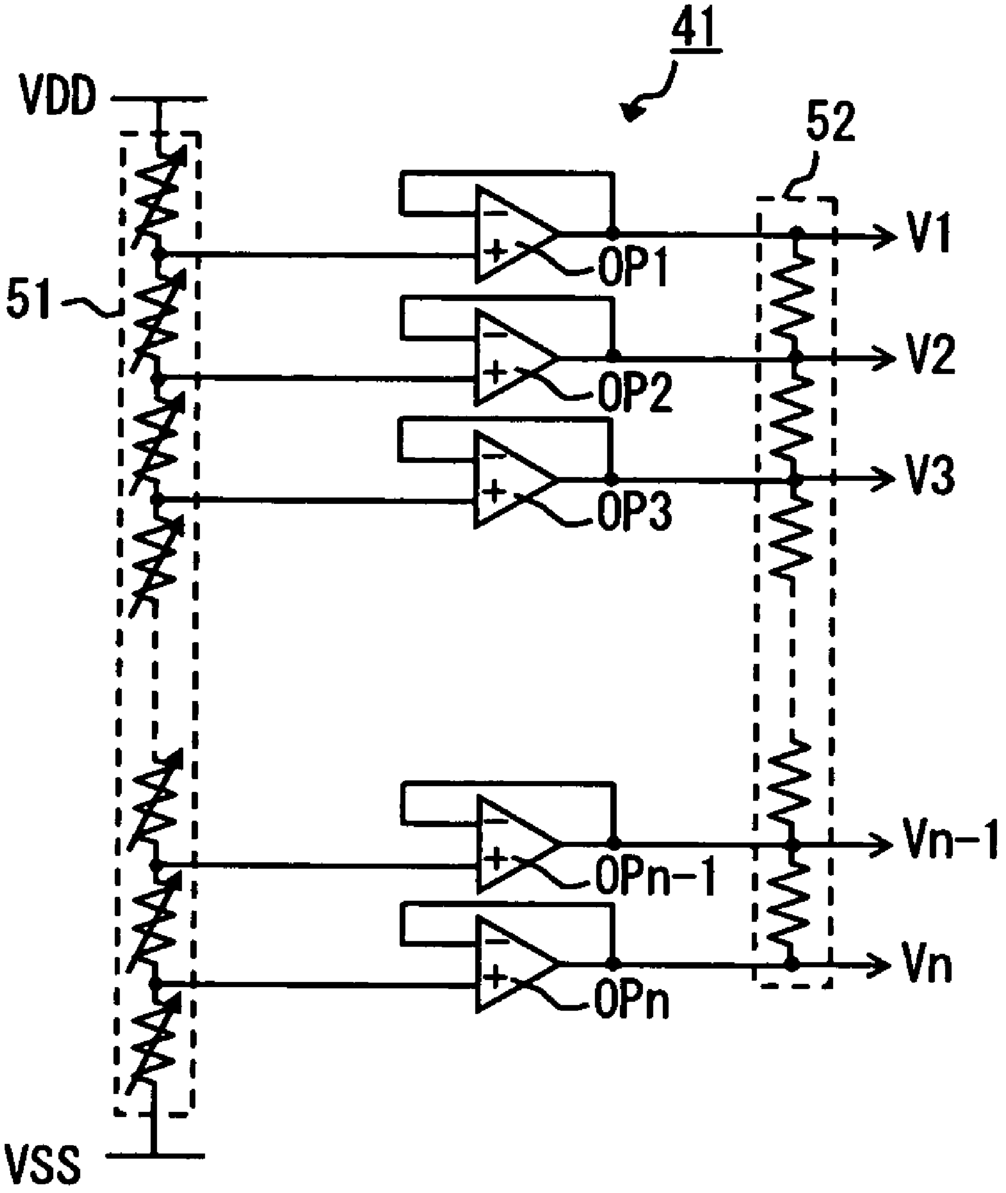
FIG. 5 is a diagram showing a conventional grayscale voltage generating circuit.

As set forth above, the conventional grayscale voltage generating circuit requires as many operational amplifiers as grayscale values. In contrast, the grayscale voltage generating circuit according to the present invention can be composed of a single input/driving stage circuit, and plural output stage circuits. Therefore, a chip area occupied by the grayscale voltage generating circuit can be reduced. In addition, when the grayscale voltage generating circuit 41 of the conventional liquid crystal display device shown in FIG. 4 is replaced by the grayscale voltage generating circuit 10 according to the present invention, a liquid crystal display device can be attained with a smaller chip area of the grayscale voltage generating circuit.

It is apparent that the present invention is not limited to the above embodiment that may be modified and changed without departing from the scope and spirit of the invention.

What is claimed is:

1. A grayscale voltage generating circuit for generating grayscale voltages, comprising:

an input/driving stage circuit amplifying an input voltage; and a plurality of output stage circuits receiving a output voltage from the input/driving stage circuit, outputting one of the grayscale voltages, and having a capacitor to keep a voltage level of the grayscale voltage, wherein the plurality of output stage circuits are sequentially switched to be connected with the input/driving stage circuit, and the output voltage from the input/driving stage circuit is fed to the plurality of output stage circuits in order, and each of the plurality of output stage circuits outputs one of the grayscale voltages based on a voltage held in the capacitor irrespective of whether or not connected with the input/driving stage circuit.

2. The grayscale voltage generating circuit according to claim 1, wherein the plurality of output stage circuits are periodically switched to be connected with the input/driving stage circuit to stabilize the output voltage from each of the output stage circuits at a predetermined value.

3. The grayscale voltage generating circuit according to claim 1, wherein the output stage circuit comprises a complementary transistor, and the capacitor is provided between a gate and a source of the complementary transistor.

4. A grayscale voltage generating circuit according to claim 1, further comprising:

a selector circuit selecting the input voltage to the input/driving stage circuit from a plural voltages; and a switch switching the plurality of output stage circuits to be connected with the input/driving stage circuit.

5. The grayscale voltage generating circuit according to claim 4, wherein the selector circuit selects the input voltage in sync with the switch switching the plurality of output stage circuits to be connected with the input/driving stage circuit.

6. The grayscale voltage generating circuit according to claim 4, wherein the output stage circuit comprises a complementary transistor, and the capacitor is provided between a gate and a source of the complementary transistor.

7. A grayscale voltage generating circuit for generating grayscale voltages, comprising:
- a first complementary transistor outputting a first voltage as one of the grayscale voltages;
- a second complementary transistor outputting a second voltage as one of the grayscale voltages;
- a first capacitor provided between a gate and a source of the first complementary transistor;
- a second capacitor provided between a gate and a source of the second complementary transistor;
- an input/driving stage circuit feeding an input voltage to the first complementary transistor and the second complementary transistor; and
- a switch switching the first complementary transistor and the second complementary transistor to be connected with the input/driving stage circuit.

8. The grayscale voltage generating circuit according to claim 7, wherein the switch is switched to connect between the input/driving stage circuit and the first complementary transistor so that the input/driving stage circuit and the first complementary transistor operate as a single operational amplifier to output the first voltage, and charge the first capacitor to hold a gate-source voltage of the first complementary transistor,
- the switch is switched to connect between the input/driving stage circuit and the second complementary transistor so that the input/driving stage circuit and the second complementary transistor to operate as a single operational amplifier to output the second voltage and charge the second capacitor to hold a gate-source voltage of the second complementary transistor, and
- the first complementary transistor continuously outputs the first voltage using the gate-source voltage held in the first capacitor even after the input/driving stage circuit is switched to be connected with the second complementary transistor.

9. The grayscale voltage generating circuit according to claim 7, wherein the first complementary transistor and the second complementary transistor are periodically connected to the input/driving stage circuit to stabilize the first voltage and the second voltage.

10. The grayscale voltage generating circuit according to claim 7, further comprising:
- a selector circuit capable of selecting one voltage from among a plurality of voltages obtained by dividing a voltage between a high-level reference voltage and a low-level reference voltage, the one voltage selected by the selector being set as an input voltage to the input/driving stage circuit.

11. The grayscale voltage generating circuit according to claim 10, wherein the voltage between the high-level reference voltage and the low-level reference voltage is divided through a plurality of variable resistors series-connected between the high-level reference voltage and the low-level reference voltage.

12. A method of generating grayscale voltages for driving a display element, comprising:
- connecting a first complementary transistor in a plurality of complementary transistors outputting the grayscale voltage, with a driving circuit driving the plurality of complementary transistors;
- outputting a first voltage from the first complementary transistor, and charging a first capacitor provided between a gate and a source of the first complementary transistor;
- switching the driving circuit to be connected with a second complementary transistor in the plurality of complementary transistors;
- outputting a second voltage from the second complementary transistor, and charging a second capacitor provided between a gate and a source of the second complementary transistor; and
- continuously outputting the first voltage from the first complementary transistor by using a voltage held in the first capacitor even after the driving circuit is switched to be connected with the second complementary transistor.

13. The method of claim 12, wherein the first complementary transistor and the second complementary transistor are periodically switched to be connected with the driving circuit to stabilize the first voltage and the second voltage.

* * * * *